United States Patent [19]

Findlater et al.

[11] Patent Number: 5,510,783
[45] Date of Patent: Apr. 23, 1996

[54] ADAPTIVE KEYPAD

[75] Inventors: Stewart M. Findlater; Kenneth T. Hickman, both of Santa Barbara, Calif.

[73] Assignee: Interlink Electronics, Inc., Carpinteria, Calif.

[21] Appl. No.: 912,544

[22] Filed: Jul. 13, 1992

[51] Int. Cl.$^6$ .................................................. H03K 17/96
[52] U.S. Cl. .............................. 341/34; 341/26; 338/47
[58] Field of Search .............................. 341/26, 33, 34, 341/24, 31, 22; 338/47, 99, 114

[56] References Cited

U.S. PATENT DOCUMENTS

| | | | |
|---|---|---|---|
| 2,951,817 | 9/1960 | Myers . | |
| 3,125,739 | 3/1964 | Deibet et al. . | |
| 3,437,973 | 4/1969 | Mabbett . | |
| 3,629,774 | 12/1971 | Crites | 338/114 |
| 3,789,167 | 1/1974 | Seeger, Jr. et al. | 200/512 |
| 3,806,471 | 4/1974 | Mitchell . | |
| 4,013,835 | 3/1977 | Eachus et al. | 341/34 |
| 4,017,697 | 4/1977 | Larson | 200/5 A |
| 4,155,262 | 5/1979 | Wong et al. | 73/754 |
| 4,163,204 | 7/1979 | Sado et al. | 338/114 |
| 4,208,648 | 6/1980 | Naumann | 338/99 |
| 4,268,815 | 5/1981 | Eventoff et al. | 338/69 |
| 4,276,538 | 6/1981 | Eventoff et al. | 338/69 |
| 4,301,337 | 11/1981 | Eventoff | 338/69 |
| 4,311,980 | 1/1982 | Prudenziati | 338/4 |
| 4,314,227 | 2/1982 | Eventoff | 338/99 |
| 4,314,228 | 2/1982 | Eventoff | 338/99 |
| 4,315,238 | 2/1982 | Eventoff | 338/99 |
| 4,441,097 | 4/1984 | Anderson | 200/5 A |
| 4,451,714 | 5/1984 | Eventoff | 200/5 A |
| 4,489,302 | 12/1984 | Eventoff | 338/99 |
| 4,492,949 | 1/1985 | Peterson et al. | 338/114 |
| 4,503,416 | 3/1985 | Kim | 200/512 |
| 4,556,871 | 12/1985 | Yoshikawa et al. | 341/26 |
| 4,734,034 | 3/1988 | Maness et al. | 340/665 |
| 4,739,299 | 4/1988 | Eventoff et al. | 341/5 |
| 5,252,971 | 10/1993 | Franz et al. | 345/168 |
| 5,296,837 | 3/1994 | Yaniger | 338/47 |
| 5,302,936 | 4/1994 | Yaniger | 338/47 |

FOREIGN PATENT DOCUMENTS

| | | |
|---|---|---|
| 0365950 | 5/1990 | European Pat. Off. . |
| 0489344 | 6/1992 | European Pat. Off. . |
| 8504994 | 11/1985 | WIPO . |

OTHER PUBLICATIONS

IBM Technical Disclosure Bulletin, vol. 25, No. 8, Jan. 1983, New York, US, pp. 4097–4098, Irwin, Jr., "Dynamically Adjustable Capacitive Key Sensing Method".

Patent Abstracts Of Japan, vol. 10, No. 27, (E-378) (2084), 4 Feb. 1986 & JP,A,60 187 134 (Matsushita Denki Sangyo) 24 Sep. 1985.

*Primary Examiner*—John K. Peng
*Assistant Examiner*—Daniel J. Wu
*Attorney, Agent, or Firm*—Merchant, Gould, Smith, Edell, Welter & Schmidt

[57] ABSTRACT

An adaptive keypad which has one or more keys includes, for each key, a pressure transducer positioned below a semi-rigid faceplate where the pressure transducer has a resistance which decreases as the pressure compressing the transducer increases. The transducer is connected in series with a capacitor to define an RC circuit for each key. Each RC circuit has a charge time proportional to the pressure applied to the key. A time capture circuit initially and thereafter intermittently, obtains the charge time for each RC circuit for each key and computes a conductance value from that time. The initial conductance value is stored in a memory. A comparing circuit intermittently compares the initial conductance value with each subsequent conductance value generated for a key. If the comparison value generated is greater than a predefined amount, a signal is generated indicating that a key has been depressed. If the comparison value is greater than a predefined amount over a selected period of time indicating a key is permanently depressed, the initial conductance stored in the memory for that key will be modified to a new value against which subsequent comparisons will be made to determine if a key is depressed.

18 Claims, 3 Drawing Sheets

ADAPTIVE KEYPAD

BACKGROUND OF THE INVENTION

The present invention relates to keypads and in particular to a rugged keypad incorporating pressure transducers and processing circuitry whereby threshold levels can be altered to accommodate changes in the physical condition of the keypad such as occur when the faceplate of the keypad is dented, damaged or otherwise distorted.

Keypads used for public telephones, control panels in industrial environments, automatic teller machines and the like are subject to extreme abuse and environmental conditions such as temperature and humidity which can damage the keypad data entry device rendering control of machinery, pay telephone, automatic teller machine and the like impossible using normal keypads. Consequently, there is a need for a keypad with no moving parts which is capable of being entirely encased to seal internal electronic components from environmental conditions. Further, the keypad should be able to utilize materials on a faceplate which are inherently durable such as stainless steel, thick hard coated Lexan or other similar materials substantially immune or significantly resistant to damage. Finally, the keypad should be able to adapt to compensate for any key region on the faceplate which is dented, gouged or distorted thereby changing the non-depressed steady state condition of one or more keys of the keypad.

The adaptability of the keypad is provided by incorporating a pressure transducer at each key and smart electronics which periodically scan the keypad to determine if a new or changed non-depressed state of a key, as indicated by the pressure sensor, has been created by a dent or distortion in the keypad and thereafter modifying the initial or non-depressed value defined for that key. The circuitry then determines whether a key is depressed by intermittently scanning the keypad and comparing the value of the pressure from each pressure sensor for each key against the non-depressed steady state value of pressure for that key. If a predefined criteria is met by the value generated from that comparison, a signal is generated indicating that the key has been depressed.

The keypad of the invention may be configured in either discreet switching elements or a continuous array where each key includes a pressure sensor which is a zero travel device capable of responding to forces applied by fingers to alter the resistance of the pressure sensor or transducer. Electronics incorporated with the invention scan the resistive keypad for changes from a static or rest condition caused by the application of a force such as by a human touch. The force is transferred through a semi-rigid faceplate material to a pressure transducer positioned below the faceplate material. Once a force threshold is surpassed, the electronic circuitry generates a signal indicating the key has been depressed. This signal is supplied to a utilization circuit. Since pressure alone causes key actuation, the keypad responds to pressure applied by gloved hands as well as implements of all types such as screwdrivers, pens and the like.

Keypads according to the invention are durable due to the use of stainless steel or plastic faceplate materials and the electronics which can sense and modify the initial or rest condition thresholds beyond which a "key depressed" indication is given, should the keypad be damaged, dented, or distorted. In effect, the pressure transducers and circuitry allow the keypad to be self-healing after damage to thereby restore the functionality of the keypad.

Keypads as described herein may be sealed and hence are operable even if totally immersed in a liquid or subjected to an environment of harsh chemicals or temperature. Furthermore, since the keypads and associated electronics are low current, passive devices, their operation is unaffected by electromagnetic radiation, vibration or shock. The keypads are thus extremely rugged and intrinsically safe. Furthermore, the keypads are of a very thin construction which can be adhesively attached to any flat surface providing additional operational and functional flexibility.

SUMMARY OF THE INVENTION

An adaptive keypad which has one or more keys, includes for each key, a pressure transducer positioned below a semi-rigid faceplate where the pressure transducer is characterized as having a resistance which varies in response to the amount of pressure applied to the transducer. A time capture circuit defines a measurement apparatus which is interconnected for intermittently obtaining a measure of the resistance across the pressure transducer. Initially, a measure of the sensor resistance representing the non-depressed state of a key on the keypad is obtained and stored in a memory. A comparing circuit interconnected to the measurement apparatus and to the memory, subsequently scans the keys of the keypad to obtain subsequent measures of the sensor resistance which are compared with the initial resistance measure stored in the memory. If the comparison value generated from that comparison meets a first predefined criteria, a signal is generated that a key has been depressed.

Finally, adaptive apparatus and circuitry is interconnected to the memory and to the comparing device for modifying the initial resistance measure stored in the memory for each pressure sensor when the comparison measure for that sensor satisfies a second predefined criteria.

In accordance with the invention, the first predefined criteria can be simply a threshold value and the second predefined criteria may, for example, be the occurrence of a comparison measure which persists for a minimum period of time indicating that a particular key has been permanently depressed. If the criteria is met, the keypad has been dented or distorted and a new initial resistance measure must be generated and stored in place of the old initial resistance measure in the memory for the keypad to continue to work.

BRIEF DESCRIPTION OF THE DRAWINGS

A complete understanding of the invention and of the above described objects and advantages may be gained from a consideration of the following description of the preferred embodiments taken in conjunction with the accompanying drawings in which.

DETAILED DESCRIPTION

Figure 1:
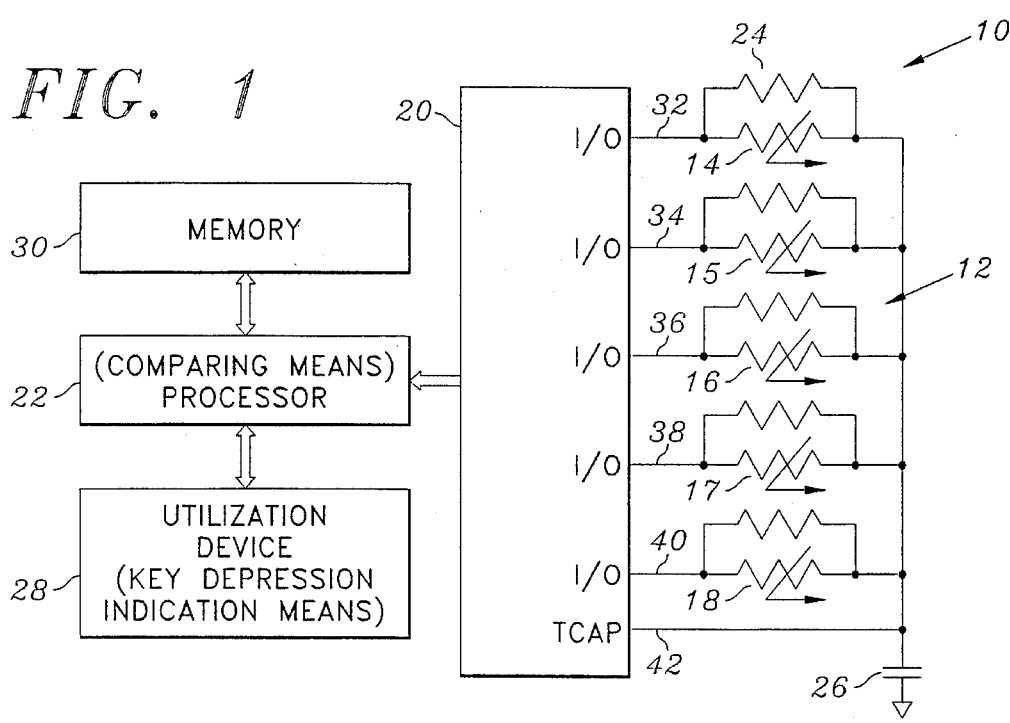
FIG. 1 is a block diagram of the adaptive keypad circuitry and system.

Referring to FIG. 1, an adaptive keypad apparatus 10, includes a pressure transducer array 12 consisting of a plurality of pressure sensors, 14, 15, 16, 17 and 18, interconnected to time capture circuit 20 which provides capacitor charge time information to a processor 22 which determines whether a key has been depressed and whether to make a parameter adjustment to account for a damaged, dented or bent keypad. The pressure transducers (sensors) 14, 15, 16, 17 and 18 are preferably of a type described in the copending and commonly assigned application Ser. No. 07/911,769, entitled "Stannous Oxide Force Transducer and Composition," filed Jul. 10, 1992, now U.S. Pat. No. 5,296,837, by Stuart I. Yaniger, or Eventoff U.S. Pat. Nos. 4,489,302 and 4,314,227.

As illustrated in FIG. 1, a measure of the resistance of each transducer 14 through 18 may be obtained by interconnecting each pressure sensor in a typical RC circuit. Accordingly, a fixed resistor 24 is coupled in parallel with the transducer 14 which is a resistor whose resistance varies in response to pressure applied to the transducer. The resistance network is interconnected in series with a capacitor 26 having one lead coupled to ground thereby forming a typical RC circuit. The time that capacitor 26 takes to charge in response to an application of voltage across the resistor 24, transducer 14 and capacitor 26 combination is proportional to the resistance of transducer 14 and hence is a measure of that resistance. Since the resistance varies in response to application of pressure, the charge time of the capacitor 26 for each transducer also comprises a measure of the pressure applied to the transducer. In the illustrated embodiment, the charge time is used to compute a conductance value which is processed to generate signals which are interconnected to be used by a utilization circuit 28 indicating when a transducer key is depressed and to modify a baseline conductance value stored in a memory 30 where a key is damaged. Of course, any other parameter which varies with the variation in resistance of the transducers 14 through 18 could also be utilized without departing from the invention.

Returning to FIG. 1, a plurality of RC circuits, one for each key of the keypad 10, is interconnected to a separate I/O port of time capture circuit 20 which may, for example, be the timer section of a Motorola MC68HC705P9 circuit. Accordingly, the series circuit for transducer 14 is interconnected to I/O port 32; the series circuit including transducer 15 is interconnection to I/O port 34; the series circuit including transducer 16 is interconnected to I/O port 36; the series circuit including transducer 17 is interconnection to I/O port 38; and the series RC circuit incorporating sensor 18 is interconnected to I/O port 40. A single capacitor 26 may be interconnected in series with each of the transducers since the time capture circuit 20 applies a voltage across each transducer individually in sequence rather than at the same time. Hence, the capacitor 26 is charged via only one of the transducers 14 through 18 at a time.

The timing sequence begins by setting I/O ports 32, 34, 36, 38 and 40 to a zero value, which resets the capacitor 26. The I/O ports 34, 36, 38 and 40 are then configured as inputs. The timer is read and the time value is stored as $T_{start}$. The I/O port 32 is set to a one value, which begins the charging of capacitor 26. After some period of time, the timer capture circuit 20 indicate that the capacitor 26 has reached the capture threshold. The captured time is read and stored as $T_{stop}$. The charge time, $T_{charge}$, is determined by the subtracting $T_{start}$ from $T_{stop}$.

The charge time value periodically measured by the time capture circuit 20 for each transducer 14 through 18 is provided to the processor 22. The processor 22 receives and processes first the initial time values to generated a baseline measure of the transducer resistances and stores those baseline values in the memory 30. The processor 22, a comparing means, subsequently performs a scanning process whereby the time values are repeatedly measured and processed to generate subsequent measures of the resistance of each transducer. The subsequent measure of resistance is compared against the initial baseline measure of the transducer resistance values stored in the memory 32. If the comparison of the subsequent resistance measure for a particular transducer meets a first predefined criteria, the processor 22 will generate a signal indicating the particular key associated with the transducer has been depressed.

The processor 22 also determines whether a change in the initial measure of resistance associated with each transducer persists beyond a predefined period of time whereupon the initial baseline measure of transducer resistance for that transducer will be modified according to a predefined criteria and stored in the memory in place of the prior baseline measure of transducer resistance. The modification in the baseline measure of transducer resistance will occur when the keypad has, for example, been dented so as to cause the faceplate itself to permanently apply pressure against the transducer. In such a circumstance, the processor 22 will modify baseline value and then compare subsequent measures of the resistance for that transducer against the new baseline value. By so adjusting the baseline measure of resistance for each transducer, the keypad 10 adapts to new steady state pressure conditions applied against the faceplate of the keypad 10. Accordingly, if the keypad is dented or otherwise damaged in a way which would make a conventional keypad useless, the present invention, utilizing the variable resistance characteristic of the transducer associated with each key, will periodically compensate for such changes in steady state pressure conditions to thereby enable the keypad 10 to continue to operate.

Figure 2:
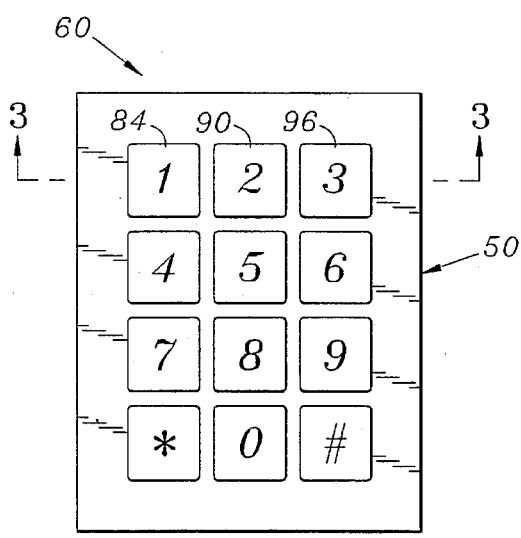
FIG. 2 is a front view of a typical faceplate for an adaptive keypad.

Turning to FIG. 2, a typical faceplate 50 of a keypad 60 which may be any type of control panel or a conventional telephone keypad is illustrated. The faceplate 50 may be made of any suitable damage resistant material which is semi-rigid such as a steel plate with a thickness of about 1/64" or less or may be a plastic faceplate having a thickness of about 1/16" or less. The particular thickness and type of faceplate is selected to be durable and rugged to provide protection to the transducer array positioned below the faceplate. The faceplate should be semi-rigid so as to provide sufficient local deformation when depressed to enable the transfer of force applied to the surface of the faceplate through the faceplate so as to cause localized pressure to be applied against the juxtaposed pressure transducer. Because each transducer measures the full range of pressure values with only very small movement, the transducer is essentially a zero travel device. Consequently, only very minute localized depression of the faceplate is required to alter the charge time of the capacitor so as to trigger an indication that the key at that location has been depressed.

Figure 3:
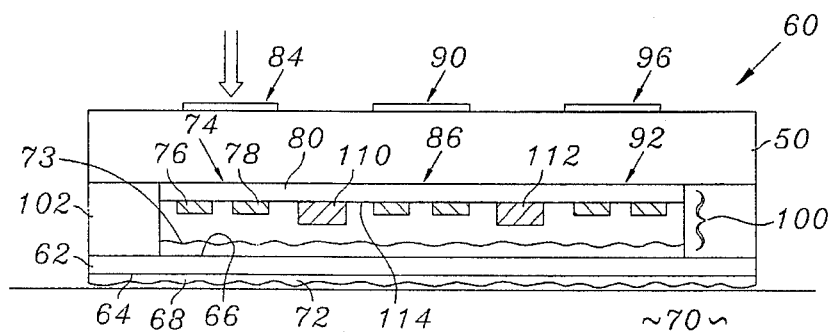
FIG. 3 is a cross-sectional view through section 3-3 of FIG. 2.

Turning to FIG. 3, the adaptive keypad 60 includes a base ply 62 having a first surface 64 and second surface 66 opposite the first surface 64. In one embodiment, an adhesive 68, such as a transfer adhesive, may be applied to the first surface 64 to enable the keypad 60 to be affixed to a mounting surface 70 of any suitable type. A pressure responsive ply 72 preferably of the type described in Eventoff U.S. Pat. Nos. 4,489,302 and 4,314,227 or co-pending and commonly assigned patent application Ser. No. 07/911,769, entitled "Stannous Oxide Force Transducer and Composition," filed Jul. 10, 1992, now U.S. Pat. No. 5,297,837, by Stuart I. Yaniger, which application is incorporated by reference herein, is disposed on the second surface 66 of the base ply 62. The cross section 3—3 of FIG. 2 depicted in FIG. 3, shows the configuration and structure of only three keys, the number one key 84, the number two key 90 and the number three key 96. However, the remaining key structures are the same as those depicted.

Figure 4:
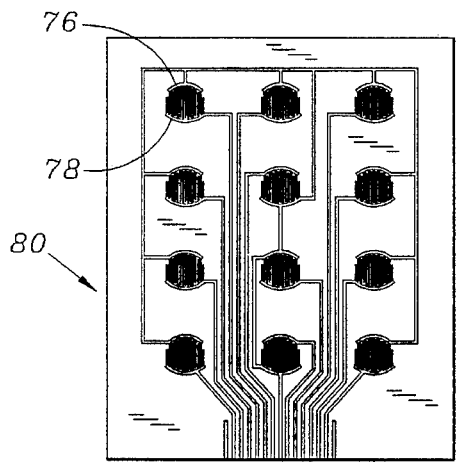
FIG. 4 is a top view of the contact configurations forming a part of the pressure transducer utilized in the present invention.

The number one key structure 84 includes a first sensor 74 defined by a first contact 76 and second contact 78 disposed in spaced apart relationship to one another on a top ply 80. Turning to FIG. 4 in conjunction with FIG. 3, the first contact 76 may define a plurality of individual conductor fingers which are interleaved with corresponding conductive fingers of the second contact 78. The first contact 76 and the second contact 78 are positioned in close proximity over the pressure responsive ply 72 so that when a force is applied to the top of the faceplate 50 adjacent the number one key, the first contact 76 and second contact 78 will press against the surface 73 of the pressure responsive ply causing current to pass through the pressure sensitive ply 72 between the first contact 76 and second contact 78. As the force is varied, the first and second contacts 76 and 78 will be pressed with greater force against the pressure responsive ply 71 increasing the contact points across the surface 73 and decreasing the surface junction resistance between the contacts 76 and 78 and the surface 73. Accordingly, the first contact 76, the second contact 78 and the juxtaposed region of the pressure responsive ply 72 define the first sensor 74. Similar structures also define a second sensor 86 which is part of the number two key 88 and a third sensor 92 which is part of the number three key 94.

The faceplate 50 is next positioned over the top ply 80 and sensors 74, 86 and 92. The faceplate 50 will have a suitable first key marking 82 in alignment with the first sensor 74 to define the number one key 84; a second key marking 90 in alignment with the second sensor 86 to define the number two key; and a third key marking 96 in alignment with the third sensor 92 to define the number three key 94.

A significant advantage of the present invention is that because only a minute vertical deflection against the pressure transducer of each key is required to cause a resistance change sufficient to indicate key depression, the keypad 60 can be made very thin with no moving parts. The keypad is accordingly readily sealed by an edge member 102 positioned to surround the pressure transducer array 100 between the faceplate 50 and the base ply 62. Of course, any other suitable housing which would seal the pressure transducer array 100 could be incorporated without departing from the invention in its broadest aspects.

In one embodiment of the invention, isolation spacers may be positioned between each of the sensor regions to enhance the isolation of the pressure applied to one region of the faceplate 50 from causing an adjacent sensor to be actuated. Accordingly, as illustrated in FIG. 3, a first isolation spacer 110 may be positioned between the first sensor 74 and the second sensor 86 with a second isolation spacer 112 positioned between the second sensor 86 and the third sensor 92. The first isolation spacer 110 and second isolation spacer 112 are preferably positioned on the conductor support surface 114 of the top ply 80 on which the sensor contacts such as the first contact 76 and the second contact 78 of the first sensor 74, are disposed. However, the isolation spacers may also be disposed on top of the pressure responsive ply 72 without departing from the invention in its broadest aspects.

In operation, a key such as the first key 84 may be depressed by applying a force F to the first key marking 82. The force transfers through the faceplate 50 which will bend very slightly in a localized area over the first sensor 74 causing the first contact 76 and the second 78 to be forced against the surface 73 of the pressure responsive ply 72. The greater the force, the greater the conduction between the first and second contacts 76 and 78 through the pressure responsive ply 72 in the region adjacent to the first sensor 74. The faceplate 50 is preferably selected to be sufficiently rigid to protect the keypad 50 and make it rugged and immune from abuse while being slightly flexible to allow localized minute deflections adjacent to the region of force application to cause the sensor below the region of force application to be affected so as to cause a variation in the resistance of the sensor in response to variations in the application of localized pressure. Because the resistance varies in response to application of pressure, it will be appreciated that if the faceplate 50 is damaged causing, for example, the region of the faceplate 50 about the number one key 84 to be dented or gouged, the first contact 76 and second contact 78 will be permanently deflected downwardly to exert pressure against the pressure responsive ply 72. However if the pressure and hence resistance reading of a particular sensor persists at a level for a predefined period of time without change, then the threshold or sensitivity for that sensor will be adjusted so that the processor will no longer give a key depressed indication at that new permanent pressure level caused by the dent. Rather, an indication that the key has been depressed will thereafter occur when additional pressure is applied beyond the new permanent pressure level. Accordingly, the present invention provides a unique and rugged self-healing keypad which can be used in environments where the keypad will take extreme abuse.

Figure 5:
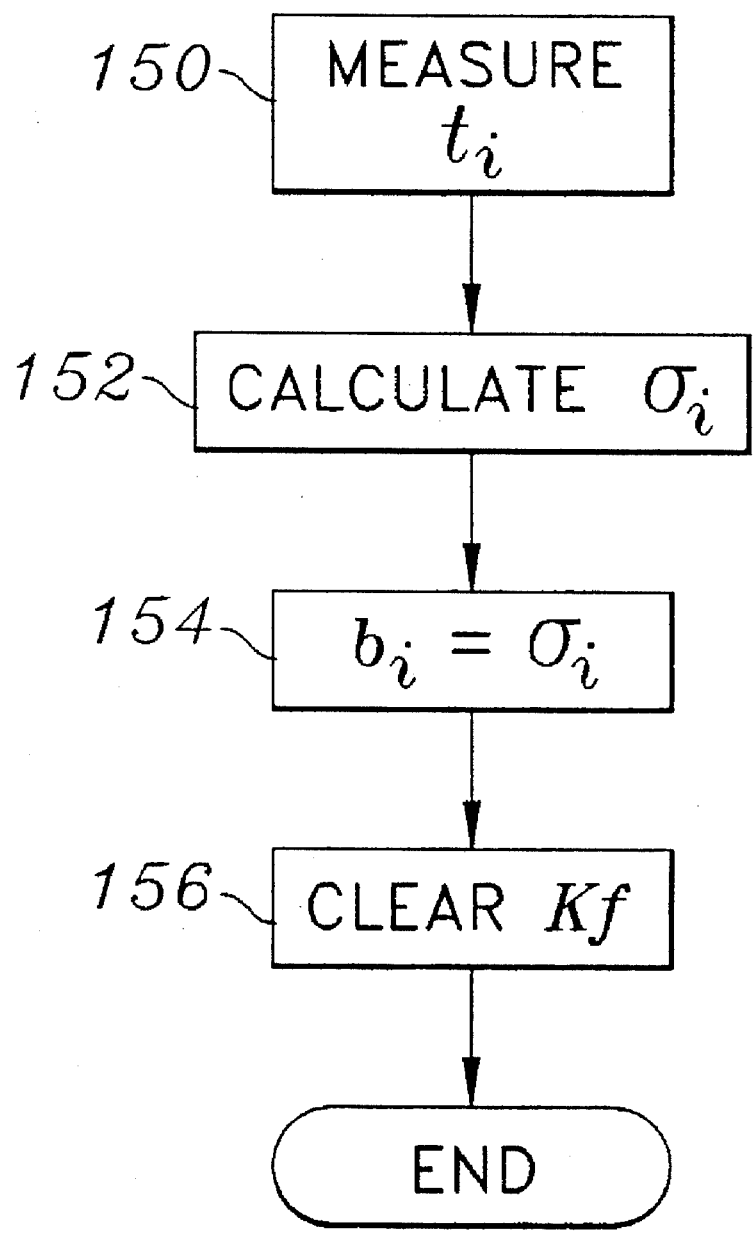
FIG. 5 is a simplified initialization routine incorporated in the present invention to define the initial values of conductance for each of the pressure transducers.
Figure 6:
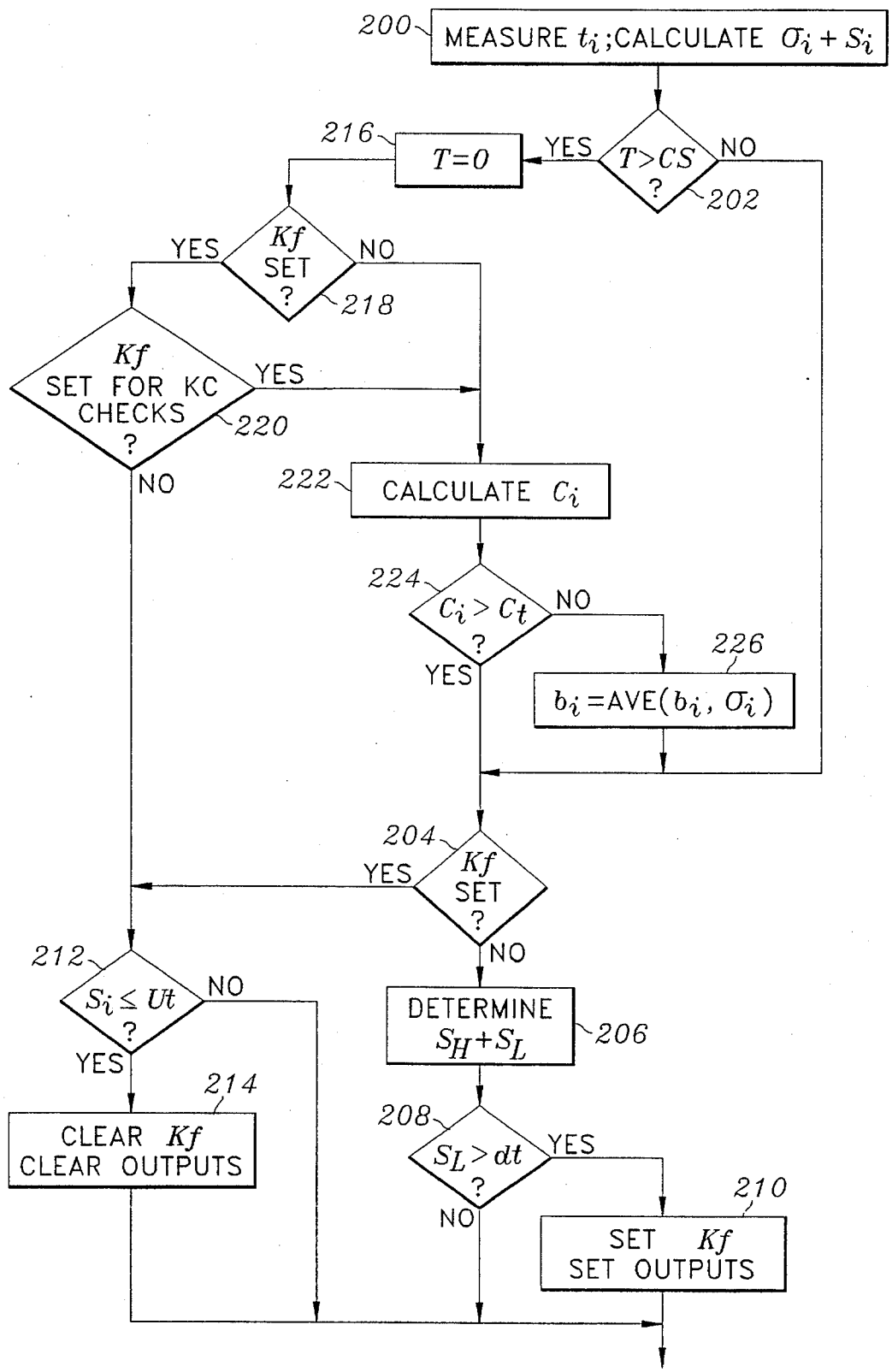
FIG. 6 is a simplified block diagram describing the keypad scan routine which receives the initial sensor conductances, receives the subsequently measured sensor conductances and applies criteria to determine whether a particular key has been depressed or whether the keypad has been damaged or distorted necessitating a modification of the stored initial value of the sensor conductance.

Turning to FIG. 5 and FIG. 6, the means of processing the pressure indicating parameter which in the illustrated embodiment is the charge time of the capacitor 26 from the time capture circuit 26 of FIG. 1 is illustrated. Initially, an initialization routine must be executed to determine the baseline or normal charge times which constitute the measure of the resistance and hence non-depressed pressure applied against each key. To establish the baseline measure of pressure for each key, the charge time $t_i$ for each key is generated by the time capture circuit 20 of FIG. 1. Once the capacitor charging time $t_i$ for each of the keys in the keypad 60 has been determined, the processor 22 calculates a sensor conductance $\sigma_i$ using the formula $K/t_i$ where K is a predefined scaling constant (see block 152). In one embodiment, the constant K is 255 where the registers storing the data are 8 bit registers.

The computed sensor conductance $\sigma_i$ for each key, "i", is stored in the memory 30 (block 154) to define the initial or baseline conductance $b_i$ for each key sensor "i". Finally, the key flag Kf which is set if the key is detected as being depressed, is cleared in block 156. As a result, the processor 22 will have initialized the adaptive keypad 10 (FIG. 1) by generating and storing in memory 30 an initial or non-depressed baseline sensor conductance $b_i$ for each key and resetting or clearing the key flag Kf. The processor then commences to intermittently perform a keypad scanning sequence to determine if a key has been depressed or if the keypad has been damaged or dented requiring that a new initial, non-depressed baseline sensor conductance value $b_i$ for a particular key must be computed and stored in the memory 30.

Referring to FIG. 6, a preferred routine for processing the measure of pressure to determine and indicate when a key is depressed and when an adjustment to the initial baseline value of the conductance measure $b_i$ is required because the keypad has been permanently dented or otherwise deformed is illustrated. Initially, the time measurement, $t_i$, from the time capture circuit 20 (FIG. 1) for each key, "i", defining the measure of the force applied against that key, is received by the processor 22. The processor 22 uses $t_i$ to calculate a measured sensor conductance $\sigma_i$ which is a scaling constant divided by the measured time $t_i$ for each key "i" (block 200). The absolute value of the difference between the measured sensor conductance $\sigma_i$ and the initial sensor conductance $b_i$, referred to as $\delta_i$, is then computed for each key (block 200).

Accordingly, the processor 22 will have defined and available to it $t_i$, the capacitor charging time for key "i"; $\sigma_i$, which is the measured sensor conductance for each key "i"; $b_i$, which is the initial sensor conductance for each key "i"; and $\delta_i$, which is the difference in conductance between the measured conductance and the initial conductance.

The processor 22 next determines whether a predefined period of time, denominated "cs", has passed since the initial sensor conductance $b_i$ was last verified. In the preferred embodiment, cs will be about 2 seconds and is defined as the minimum time between adjustments of $b_i$. If the actual time, T, is less than cs seconds in block 202, then no adjustment to the initial sensor conductance, $b_i$, will take place and the processor 22 will check the key flag Kf in block 204. A set key flag Kf indicates that a key has been depressed. On the other hand, if the key "i" is not depressed, $Kf_i$ will not be set. Assuming that a key has not been depressed, the processor will execute block 206 by determining the maximum value in the $\delta_i$ array denominated $\delta_H$, and $\delta_L$ which is the minimum of $|\delta_H - \delta_i|$ for all values of "i" not equal to "H".

Once $\delta_H$ and $\delta_L$ are determined in block 206, $\delta_L$ is compared against dt which is the down difference threshold value of the keys. If $\delta_L$ is greater than the down threshold, dr, then the key flag Kf is set and the BCD key identifier code for the particular depressed key is generated and outputed by the processor 22 to the utilization circuit 28 (block 210). If $\delta_L$ is less than the down threshold dt then the key flag Kf remains unset and the scan routine terminates.

If the key flag Kf is set when the test in block 204 is conducted, then all the components of $\delta_i$ are compared with the up threshold Ut in block 212. If $\delta_i$ for all "i" are less than or equal to the up threshold, Ut, the key flag Kf is cleared in block 214 indicating that the key is no longer depressed. If $\delta_i$ for all "i" is not less than or equal to the up threshold, Ut, then the key flag Kf remains set and the keypad scan routine is exited.

Returning to block 202, if the time T is greater than cs, then T is immediately set to 0 in block 216 and the key flag Kf is checked in block 218. If the key flag is down indicating a particular key has been set, then the key flag is further checked in block 220 to determine if that key flag has been set for "KC" number of checks. In the typical embodiment, KC will be seven or eight. Since the part of the routine commencing with block 216 will only be performed every 2 seconds, no change in Kf for seven or eight times through the branch containing block 216 and 218, will indicate that Kf has remained continuously depressed for as long as 14 to 16 seconds. Under such circumstances, the conclusion can validly be made that the key has been permanently depressed by a bend, dent or other deformation and hence the initial sensor conductance value $b_i$ for that key should be modified. On the other hand, if the key flag Kf has not been set for KC consecutive checks, then the program performs the check previously described in block 212.

If the key flag Kf has been set for KC consecutive checks, the program branches to the portion of the program which adjusts the value of $b_i$ for all values of "i" key to indicate a new initial value against which measured pressure values will be compared in the future to determine whether the key is set or not. Hence, the initial pressure measure is altered for each key to a new initial pressure value. In order to make the adjustment, the program first computes $C_i$ which is the absolute value of $\delta_i$ of the current scan less $\sigma_i$ for the previous scan (block 222). A change threshold constant, Ct, previously set and stored, is then compared against $C_i$ (block 224). If $C_i$ is greater than Ct then no revision of $b_i$ is generated and $b_i$ for that particular key remains the same and the program proceeds to perform the steps commencing with block 204. On the other hand, if $C_i$ is less than Ct, then a new value of $b_i$ is computed and stored. Since the current value of $b_i$ may not be completely accurate and it is desired to have the value of $b_i$ change only slowly, the new $b_i$, which is computed if $C_i$ is less than Ct, is the average value of the old initial value of $b_i$ and $\sigma_i$ which is $K/t_i$. The program then performs the above-described routine starting with block 204.

Returning to block 218, if the key flag Kf is not set indicating that a key is not depressed, then blocks 222, 224 and 226 are performed as above described to determine whether Kf has been set for KC checks as described in connection with block 220.

In one illustrated embodiment, the keypad scan routine of FIG. 6 scans all the keys approximately every 1/100 of a second where the number of keys may be any number between 1 for a keypad with just a single switch, through 12 for a conventional telephone keypad, to any other number such as when the keypad is a complex control panel.

While the above description has been made in connection with specific embodiments, it will be appreciated that many variations are possible without departing from the spirit of the present invention. For example, the specific criteria for updating the initial sensor conductances for the keys in block 226 may be accomplished any number of different ways. Consequently, the present invention contemplates the modification of the initial, non-depressed measure of pressure for a particular key to be adjustable according to some criteria when the keypad is permanently depressed. Likewise, the particular parameter which is measured, while referred to herein as conductance, could be any convenient parameter that correlates with variations in pressure and need not be the conductance or the time of charging of a capacitor in an RC circuit where the resistance is the pressure transducer resistance. Accordingly, the following claims are not limited to the specific embodiments described but are intended to encompass the invention in its broadest scope.

What is claimed is:

1. An adaptive key pad apparatus having at least one key, comprising:

a pressure transducer apparatus for each key defining a pressure responsive sensor, each sensor generating a parameter which varies in response to an amount of pressure applied to the sensor;

a measurement device coupled for obtaining an initial measure of the parameter for each sensor and thereafter intermittently obtaining a subsequent measure of the parameter for each sensor;

a memory for storing the initial parameter for each sensor;

a comparing device coupled to the measurement device and to the memory for generating a comparison value for each sensor in response to a comparison of each subsequent parameter measure of that sensor with the initial parameter measure of that sensor and generating an depressed key indication when the comparison value for that sensor meets a first predefined criteria; and an adaptive device coupled to the memory and to the measurement device for modifying the initial parameter stored in the memory for each sensor when the subsequent parameter measure for that sensor satisfies a second predefined criteria.

2. The adaptive keypad of claim 1 wherein the sensors have a resistance which varies in response to the pressure applied, the initial parameter being a measure of the resistance of the pressure transducer and the subsequent parameter being a measure of the resistance of the pressure transducer.

3. The adaptive keypad apparatus of claim 1 further comprising a faceplate juxtaposed over the pressure transducer apparatus, the faceplate having at least one keypad indicator disposed thereon, each keypad indicator positioned adjacent to a selected one of the sensors.

4. The adaptive keypad apparatus of claim 3 wherein the faceplate is semi-rigid and each key sensor is responsive to pressure applied to the semi-rigid faceplate at a location juxtaposed over the sensor.

5. The adaptive keypad apparatus of claim 4 wherein the faceplate is a stainless steel plate having a thickness of about 1/64 inch.

6. The adaptive keypad of claim 4 wherein the faceplate is a plastic ply having a thickness of about 1/16 inch.

7. The adaptive keypad apparatus of claim 3 further comprising identifying markings disposed on the surface of the faceplate remote from the pressure transducer apparatus, each identifying marking juxtaposed over the sensor associated with the identifying marking.

8. The adaptive keypad apparatus of claim 2 wherein the measurement circuit comprises for each sensor:

a capacitor in series with the sensor resistance associated with each key for defining an RC circuit characterized by a capacitor charging time which varies in response to variations in the resistance of the sensor;

a power source for being sequentially interconnected to each RC circuit for causing the capacitor to charge; and a time capture circuit interconnected to the RC circuit of each key for measuring the time required for the capacitor to charge to a predefined voltage after being interconnect to the power source.

9. The adaptive keypad apparatus of claim 8 further comprising a faceplate juxtaposed over the pressure transducer apparatus, the faceplate having at least one keypad indicator disposed thereon, each keypad indicator positioned adjacent to a selected one of the sensors.

10. The adaptive keypad apparatus of claim 8 wherein the charge time measured by the time capture circuit for each sensor is stored in the memory, the charge time comprising the measure of the initial parameter for that sensor.

11. The adaptive keypad apparatus of claim 1 wherein the adaptive device further comprises:

a differencing device for computing a difference between the initial parameter and the subsequent parameter on a first scan to define a first difference for one sensor, computing the difference between the initial parameter and the subsequent resistance value on a second subsequent scan to define a second difference for that sensor, and computing the difference between the first difference and the second difference to define a variance value for that sensor; and a modifying device for averaging the initial parameter and the subsequent parameter from the first scan to define a new initial parameter for that sensor, the new initial parameter being stored in the memory in place of the existing initial parameter when the variance value meets the predefined second criteria.

12. The adaptive keypad apparatus of claim 11 wherein the second criteria is met when the variance value for a sensor is greater than a predefined threshold variance value.

13. The adaptive keyboard apparatus of claim 1 further comprising an adaptive timer for intermittently enabling computation of a new initial parameter according to a predefined enabling schedule.

14. The adaptive keyboard apparatus of claim 13 wherein the predefined enabling schedule is about once every two seconds.

15. The adaptive keyboard apparatus of claim 2 wherein the initial parameter is an initial resistance measure and the subsequent parameter is a subsequent resistance measure for each sensor where the initial and subsequent resistance measures comprise the conductance of each sensor.

16. An adaptive keypad apparatus comprising:

a key array comprising a plurality of key circuits, each key circuit comprising a sensor with a variable resistance characterized by a non-depressed steady state resistance, the sensor resistance being interconnected in series with a capacitor for defining an RC circuit with a charge time which varies in response to the resistance of the sensor;

a time capture circuit interconnected to the plurality of key circuits for measuring the charge time of each circuit;

an adaptive processor for receiving the charge time of each key circuit and processing that charge time according to a predefined criteria for generating an indication of when a key in the plurality of keys has been depressed and further generating a modification of the predefined criteria for any of the keys in response to a permanent alteration of the non-depressed steady state condition of that key.

17. An adaptive keypad apparatus having at least one key comprising:

a pressure sensor for each key;

pressure measurement means interconnected to each pressure sensor for generating a initial measure of the pressure applied to each sensor and thereafter intermittently generating a subsequent measure of the pressure applied to each sensor;

key depression indication means interconnected for comparing the initial pressure measure for each key with each subsequent pressure measure for that key to generate a first compare value and generating a depressed key indication if the compare value satisfies a first pre-defined criterion; and adaptive means interconnected for comparing the initial pressure measure for each key with each subsequent pressure measure for that key to generate a second compare indication and modifying the initial pressure measure for that key if the second compare indication meets a second predefined criteria.

18. An method of modifying the sensitivity of individual keys on a keypad apparatus having at least one key and a pressure sensor associated with each key comprising the steps of:

scanning each key of the keypad and measuring the pressure applied against each key on a first scan for generating a initial measure of the pressure applied to each sensor;

intermittently scanning each key of the keypad and measuring the pressure applied against each key on each subsequent scan for generating a subsequent measure of the pressure applied to each sensor;

comparing the initial pressure measure for each key with each subsequent pressure measure for that key to generate a first compare value;

generating a depressed key indication if the first compare value satisfies a first predefined criteria;

comparing the initial pressure measure for each key with each subsequent pressure measure for that key to generate a second compare value; and modifying the initial pressure measure for a key if the second compare value for that key satisfies a second predefined criteria.

* * * * *

UNITED STATES PATENT AND TRADEMARK OFFICE
CERTIFICATE OF CORRECTION

PATENT NO. : 5,510,783

DATED : April 23, 1996

INVENTOR(S) : Stewart M. Findlater; Kenneth T. Hickman

It is certified that error appears in the above-identified patent and that said Letters Patent is hereby corrected as shown below:

Column 4, line 5, "indicate" should read --indicates--

Column 4, line 8, insert --of-- after the word "subtracting"

Column 4, line 12, "generated" should read --generate--

Column 5, line 10, "5,297,837" should read --5,296,837--

Column 7, line 47, "outputed" should read --output--

Column 8, line 18, "$\delta_i$" should read --$\sigma_I$--

Column 9, cl-8 56, "interconnect" should read --interconnected--

Column 11, line cl-18 4, "An" should read --A--

Signed and Sealed this

Eleventh Day of February, 1997

Attest:

BRUCE LEHMAN

*Attesting Officer*   *Commissioner of Patents and Trademarks*